United States Patent
Kim et al.

(10) Patent No.: US 8,031,544 B2
(45) Date of Patent: Oct. 4, 2011

(54) SEMICONDUCTOR MEMORY DEVICE WITH THREE-DIMENSIONAL ARRAY AND REPAIR METHOD THEREOF

(75) Inventors: Doo-Gon Kim, Hwaseong-si (KR); Ki-Tae Park, Seongnam-si (KR)

(73) Assignee: Samsung Electronics Co., Ltd., Suwon-si, Gyeonggi-do (KR)

(*) Notice: Subject to any disclaimer, the term of this patent is extended or adjusted under 35 U.S.C. 154(b) by 411 days.

(21) Appl. No.: 12/336,827

(22) Filed: Dec. 17, 2008

(65) Prior Publication Data

US 2009/0180339 A1    Jul. 16, 2009

(30) Foreign Application Priority Data

Jan. 15, 2008  (KR) .................... 10-2008-0004552

(51) Int. Cl.
*G11C 29/00*  (2006.01)
(52) U.S. Cl. ..................... 365/200; 365/225.7
(58) Field of Classification Search ............. 365/200, 365/96, 225.7, 185.09, 185.11, 230.03
See application file for complete search history.

(56) References Cited

U.S. PATENT DOCUMENTS

| | | | |
|---|---|---|---|
| 5,835,396 A | 11/1998 | Zhang | |
| 6,034,882 A | 3/2000 | Johnson et al. | |
| 7,002,825 B2 | 2/2006 | Scheuerlein | |
| 7,342,843 B2* | 3/2008 | Takeuchi et al. | 365/225.7 |
| 7,589,552 B1* | 9/2009 | Guzman et al. | 326/10 |
| 7,590,015 B2* | 9/2009 | Kodaira et al. | 365/200 |
| 2002/0054529 A1* | 5/2002 | Nishino et al. | 365/219 |
| 2006/0221728 A1 | 10/2006 | Fasoli et al. | |
| 2008/0198646 A1* | 8/2008 | Park et al. | 365/148 |

FOREIGN PATENT DOCUMENTS

KR  1020060019947 A  6/2006
KR  1020070036550 A  4/2007

* cited by examiner

*Primary Examiner* — Gene N. Auduong
(74) *Attorney, Agent, or Firm* — Volentine & Whitt, PLLC

(57) ABSTRACT

A nonvolatile memory device includes a three-dimensional (3D) cell array, a column selection circuit and a fuse block. The 3D cell array includes multiple cell arrays located in corresponding stacked substrate layers, the cell arrays sharing a bit line. The column selection circuit selects a memory unit included in the 3D cell array. The fuse block controls the column selection circuit to repair defective columns with one of multiple redundant bit lines located in the 3D cell array.

25 Claims, 14 Drawing Sheets

SEMICONDUCTOR MEMORY DEVICE WITH THREE-DIMENSIONAL ARRAY AND REPAIR METHOD THEREOF

PRIORITY CLAIM

A claim of priority is made to Korean Patent Application No. 10-2008-0004552, filed on Jan. 15, 2008, in the Korean Intellectual Property Office, the subject matter of which is hereby incorporated by reference.

SUMMARY

Embodiments of the present invention relate to semiconductor memory devices, and more particularly, to a nonvolatile memory device with a three-dimensional (3D) array structure, providing means and method for repairing the 3D array.

Along with development of semiconductor fabrication technologies, there is growing demand for high density memories. For example, high density memories may be provided in a memory device having a three-dimensional (3D) array structure (hereinafter, referred to as "3D memory device"). There have been a number of approaches to 3D memory devices, such as U.S. Pat. No. 5,835,396 (issued Nov. 10, 1998), entitled "Three-Dimensional Read-Only Memory," U.S. Pat. No. 6,034,882 (issued Mar. 7, 2000), entitled "Vertically Stacked Field Programmable Nonvolatile Memory and Method of Fabrication," and U.S. Pat. No. 7,002,825 (issued Feb. 21, 2006), entitled "Word Line Arrangement Having Segmented Word Lines," all of which are hereby incorporated by reference.

A 3D memory device includes memory cell arrays formed in multiple semiconductor material layers. The semiconductor material layers may include a well-known silicon substrate and layers sequentially stacked on the silicon substrate. Varieties of process techniques are used for stacking such layers or substrates. Many types of techniques are being applied to 3D memory devices to shield deviations of electrical characteristics between the stacked substrates or layers. Therefore, technical promotion must be considered for lessening electrical deviations between memory cells formed on a stacked substrate or layer, and between memory cells formed on a non-stacked substrate or layer.

The advent of the 3D memory device significantly contributes to extending storage capacity of a memory device having restricted area. Thus, in order to efficiently operate and drive the 3D memory device, it is necessary to optimize characteristics of the 3D memory device, including memory cells fabricated in a multi-layer substrate. For example, repair operations for defective memory cells are important with respect to functional reliability.

An aspect of the present invention provides a nonvolatile memory device, including a three-dimensional (3D) cell array, a column selection circuit and a fuse block. The 3D cell array includes multiple cell arrays located in corresponding stacked substrate layers, the cell arrays sharing a bit line. The column selection circuit selects a memory unit included in the 3D cell array. The fuse block controls the column selection circuit to repair defective columns with one of multiple redundant bit lines located in the 3D cell array.

Another aspect of the present invention provides a nonvolatile memory device including a 3D cell array, a column selection circuit and a fuse block. The 3D cell array includes multiple cell arrays located in corresponding stacked substrate layers, the cell arrays sharing a bit line. The column selection circuit selects a bit line connected to the 3D cell array. The fuse block controls the column selection circuit to repair defective columns using one of redundant bit lines located in the 3D cell array in response to a layer address and a column address corresponding to the substrate layer. The 3D cell array further includes first memory units corresponding to the substrate layers and connected to a first bit line, second memory units corresponding to the substrate layers and connected to a second bit line, and redundant memory units corresponding to the substrate layers and connected to a redundant bit line.

Another aspect of the present invention provides a nonvolatile memory device including a 3D cell array, a column selection circuit and a fuse block. The cell array includes multiple cell arrays formed in corresponding stacked substrate layers, the cell arrays sharing a bit line. The column selection circuit selects a bit line connected to the 3D cell array. The fuse block controls the column selection circuit to repair a defective column with a redundant bit line located in the 3D cell array in response to a column address. The 3D cell array further includes multiple first memory units corresponding to the substrate layers and connected to a first bit line, multiple second memory units corresponding to the substrate layers and connected to a second bit line, multiple first redundant memory units corresponding to the substrate layers and connected to a first redundant bit line, and multiple second redundant memory units corresponding to the substrate layers and connected to a second redundant bit line.

Another aspect of the present invention provides a nonvolatile memory device including a 3D cell array, multiple row decoders, and a fuse block. The 3D cell array includes multiple cell arrays located in stacked substrate layers. The row decoders correspond to the cell arrays and select memory blocks of the cell arrays. The fuse block controls the row decoders to repair defective memory blocks of cell arrays with redundant memory blocks located in the cell arrays.

Still another aspect of the present invention provides a nonvolatile memory device including a 3D cell array, multiple row decoders, and a fuse block. The 3D cell array includes multiple cell arrays in corresponding stacked substrate layers. The row decoders correspond to the substrate layers and select memory blocks from the cell arrays. The fuse block controls the row decoders to repair defective memory blocks of the cell arrays with a redundant memory block of the substrate layer having one of the cell arrays.

With these structures, the nonvolatile memory device according to embodiments of the present invention improves repair efficiency. The 3D memory device executes a repair operation to a defective memory area, even with the complicated 3D cell array structure. Moreover, the stacked layers may share memory units, further enhancing repair efficiency.

BRIEF DESCRIPTION OF THE DRAWINGS

Non-limiting and non-exhaustive embodiments of the present invention will be described with reference to the attached drawings, where like reference numerals refer to like parts unless otherwise specified, in which.

DETAILED DESCRIPTION OF THE EMBODIMENTS

Figure 1:
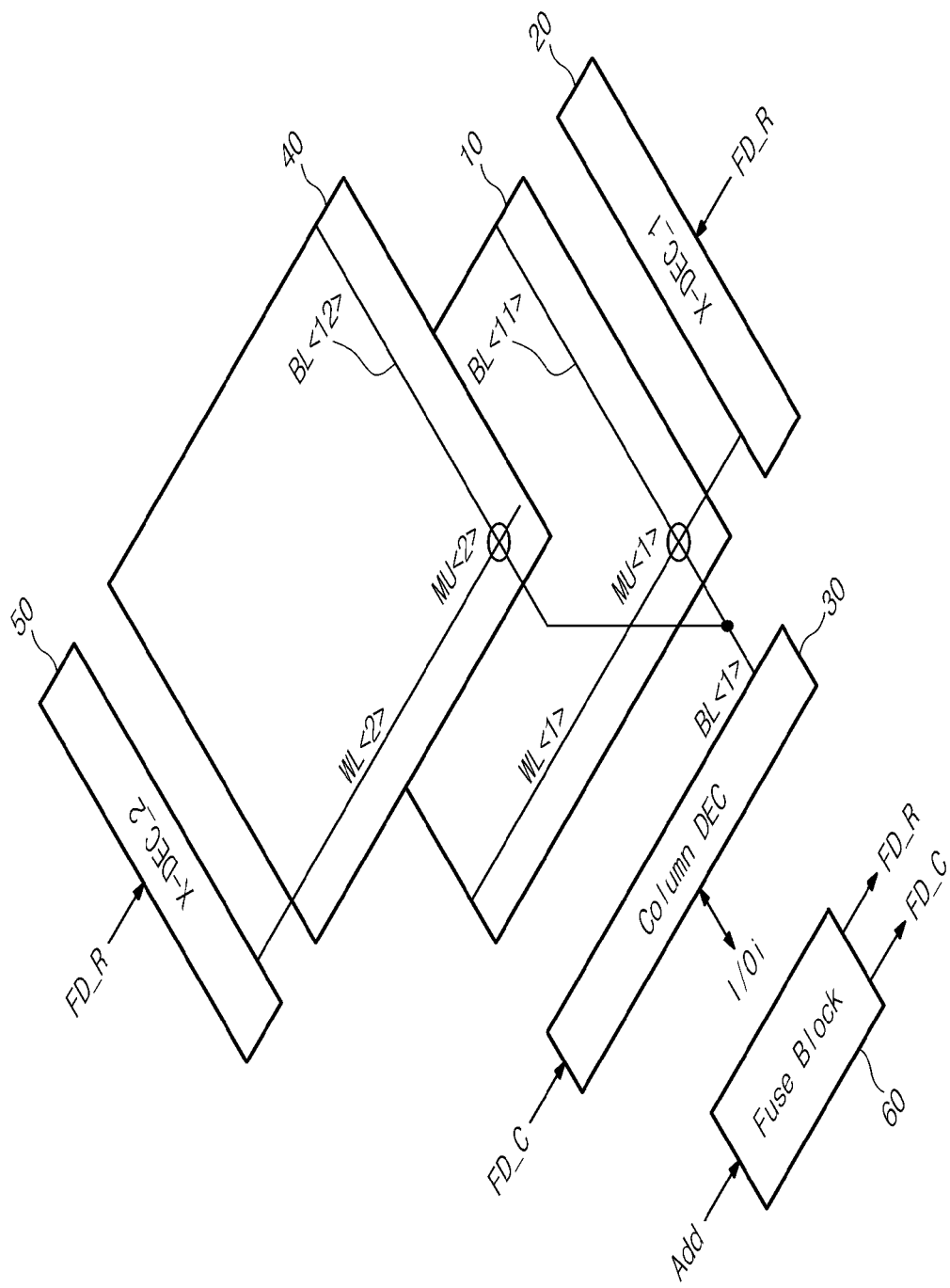
FIG. 1 is a block diagram of a memory device including a 3D cell array, according to an embodiment of the present invention.

The present invention will now be described more fully with reference to the accompanying drawings, in which exemplary embodiments of the invention are shown. The invention, however, may be embodied in various different forms, and should not be construed as being limited only to the illustrated embodiments. Rather, these embodiments are provided as examples, to convey the concept of the invention to one skilled in the art. Accordingly, known processes, elements, and techniques are not described with respect to some of the embodiments of the present invention. Throughout the drawings and written description, like reference numerals will be used to refer to like or similar elements. Also, in the drawings, the sizes and relative sizes of components and regions may be exaggerated for clarity.

FIG. 1 is a block diagram of a three-dimensional (3D) memory device including a 3D cell array, according to an illustrative embodiment of the present invention. Referring to FIG. 1, the 3D memory device includes cell arrays 10 and 40 respectively formed in two substrate layers, and selection circuits 20, 30 and 50 for designating memory units MU<1> and MU<2> included in the cell arrays 10 and 40, respectively. The 3D memory device also includes a fuse block 60 for conducting repair operation along columns. In this description, cell arrays (e.g., cell arrays 10 and 40) arranged in multiple substrate layers are collectively referred to as a "3D cell array." A description follows regarding repairing defects in the 3D memory device having the 3D cell array.

The first and second cell arrays 10 and 40 denote arrays of the memory units formed in substrate layers (or layers) different from each other. The first cell array 10 includes multiple memory units arranged on a first substrate layer. In FIG. 1, for convenience of illustration, only one memory unit MU<1> is shown on the first substrate layer as a representative memory unit included in the first cell array 10. The memory unit MU<1> may be selected by word line WL<1> and bit line BL<1>. Likewise, in FIG. 1, only one memory unit MU<2> is shown on the second substrate layer as a representative memory unit included in the second cell array 40. The memory unit MU<2> may be selected by word line WL<2> and bit line BL<1>. However, as a practical matter, each substrate layer includes multiple word lines and bit lines, and multiple memory units disposed at intersections of the word lines and bit lines.

The first row decoder (X-DEC_1) 20 and the second row decoder (X-DEC_2) 50 may be independently formed in the substrate layers, or the row decoders 20 and 50 may be arranged in a single substrate layer to improve efficiency of the fabrication process. The first row decoder 20 conducts row selection (or word line selection) for the memory units of the first cell array 10. The first row decoder 20 selects one row or memory block from the first cell array 10 in response to a row address. The second row decoder 50 operates independently of the first row decoder 20 in the same manner with respect to the second cell array 40. The first and second row decoders 20 and 50 are also able to conduct their own repair operations, independent from each other, in response to fuse data FD_R provided for row repair.

The column decoder 30 selects columns (or bit lines) corresponding to column addresses. In the 3D cell array structure, a bit line selected by the column decoder 30 is connected to bit lines corresponding to columns of the substrate layers. For example, selection of the bit line BL<1> by the column decoder 30 results in coincidental selection of bit line BL<11> corresponding to the first cell array 10 and bit line BL<12> corresponding to the second cell array 40. Thus, the memory unit MU<1> and the memory unit MU<2> share the bit line BL<1>. Although the bit lines BL<11> and BL<12> are depicted according to dispositions of the substrate layers for the sake of discussion, it is understood that the two bit lines are substantially included in the bit line BL<1>. In particular, the substrate layers are formed in a column structure sharing each bit line. Further, although FIG. 1 shows only a single bit line (e.g., bit line BL<1>), it is understood that essentially the same structure is applied to all bit lines connected to the column decoder 30.

The fuse block 60 detects an input address and generates fuse data FD_C for a column repair operation or fuse data FD_R for a row repair operation. In various embodiments, the fuse block 60 is able to repair multiple defective columns with a single redundant column. Further, regardless of the location of the substrate layer, a defective memory block can be replaced in a substrate layer where there is no defective memory block.

The 3D memory device may be a nonvolatile memory device, for example. For instance, the 3D memory device may be implemented in a flash memory device, a phase-change random access memory (RAM), a ferroelectric RAM, etc. However, various embodiments are not restricted to nonvolatile memory devices. Meanwhile, each of the representative memory units MU<1> and MU<2> may be a storage unit corresponding to a memory cell, a page, a memory block, a memory string or a column, for example.

As stated above, the 3D memory device according to embodiments of the present invention includes the cell arrays 10 and 40 corresponding to the first and second substrate layers, respectively. Each of the cell arrays 10 and 40 includes a redundant memory area in order to repair defective memory units arising from the cell arrays 10 and 40 stacked in three dimensions. A layer address for selecting the cell array 10 or cell array 40 is provided for replacing a defective memory area with the redundant memory area.

The memory units MU<1> and MU<2> respectively formed in the first and second substrate layers are connected to the same line BL<1>, which is a consideration in repair operations. This structure, e.g., two memory units in two substrate layers sharing a single bit line, is applied to all memory units of the first and second cell arrays 10 and 40. Therefore, although the repair operation for replacing defective memory units is described with reference to the first and second cell arrays 10 and 40, respectively formed in the first and second substrate layers, it is understood that the description applies to other memory units in these and other substrate layers, as well as to more than two stacked substrate layers.

Figure 2:
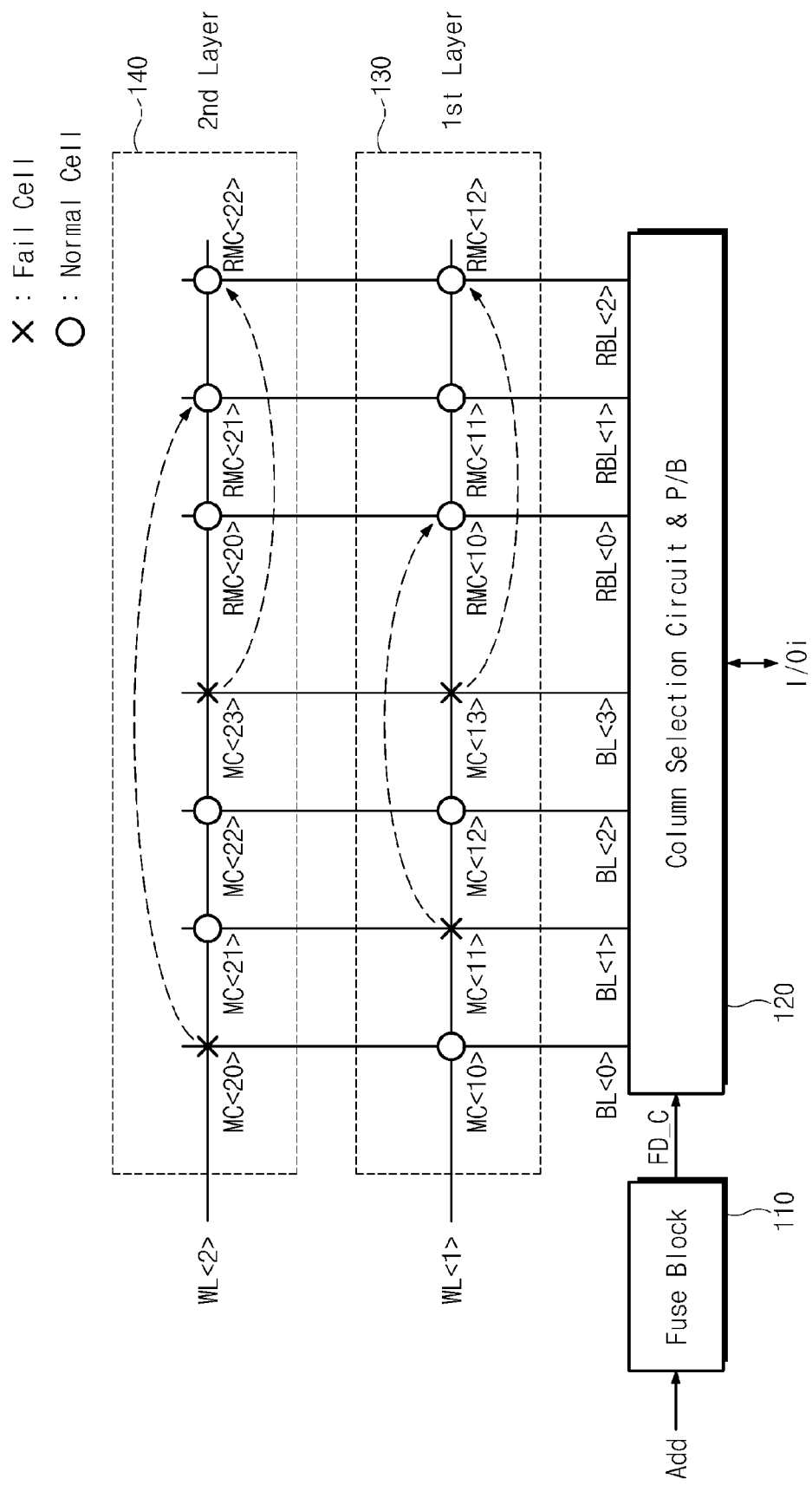
FIG. 2 is a schematic diagram illustrating a repair method, according to a first embodiment of the present invention.

FIG. 2 is a schematic diagram illustrating a repair method, according to a first illustrative embodiment of the present invention. Referring to FIG. 2, the repair operation is indicated by arrows following a sequence conducted by the column selection circuit & page buffer 120 in response to repair signals or fuse data FD_C provided from a fuse block 110.

The first substrate layer 130 includes memory cells MC<10>, MC<11>, MC<12> and MC<13>, and redundant memory cells RMC<10>, RMC<11> and RMC<12> for replacing defective memory cells. The second substrate layer 140 includes memory cells MC<20>, MC<21>, MC<22> and MC<23>, and redundant memory cells RMC<20>, RMC<21> and RMC<22> for replacing defective memory cells. The memory cells MC<10> and MC<20> included in the first and second substrate layers 130 and 140 share the bit line BL<0>. Thus, to program the memory cell MC<20>, for example, ground voltage is applied to the bit line BL<0>, also connected to the memory cell MC<10>, and a program voltage is applied to the word line WL<2>. By this operation, even though the bit line BL<0> is shared, it is possible to alternatively read or program the memory cells MC<10> and MC<20>.

However, replacing a defective cell would change this arrangement. Therefore, replacing a defective cell with a redundant memory cell causes technical difficulty when the memory cells included in the substrate layers are sharing a bit line. According to the first embodiment of the present invention, a bit line connected to a defective cell is replaced by one redundant bit line. That is, a bit line (e.g., BL<0>, BL<1>, BL<2> or BL<3>) connected to a defective cell, which belongs to one of the first and second substrate layers 130 or 140 is replaced with a selected one of the redundant bit lines (e.g., RBL<0>, RBL<1> or RBL<2>). When memory cells included in the first and second substrate layers 130 and 140 sharing a single bit line are both defective, one redundant bit line may be used for the repair. However, defective bit lines assigned to different column addresses cannot be replaced by one redundant bit line, as described below.

For example, among the memory cells sharing the bit line BL<0>, it may be assumed that there is a defect only in the memory cell MC<20> located in the second substrate layer 140. In this case, the fuse block 110 is programmed to replace the bit line BL<0> with a redundant bit line, such as redundant bit line RBL<1>. Additionally, among the memory cells sharing the bit line BL<1>, it may be assumed that there is a defect only in the memory cell MC<11> located in the first substrate layer 130. In this case, the fuse block 110 is programmed to replace the bit line BL<1> with another redundant bit line, such as redundant bit line RBL<0>. In this example, the bit line BL<2> is not repaired by a redundant bit line because there are no defective memory cells sharing the bit line BL<2>.

Further, among memory cells sharing the bit line BL<3>, assuming that memory cells MC<13> and MC<23> included in the first and second substrate layers 130 and 140 are both defective, it is relatively easy to repair them. In particular, the bit line BL<3> is simply replaced with a redundant bit line, such as redundant bit line RBL<2>, simultaneously repairing the defective memory cells MC<13> and MC<23> sharing the bit line BL<3>.

The fuse block 110 receives an input address ADD. For the repair operation discussed above, it is necessary to detect whether the input address ADD includes a column address corresponding to a bit line connected to a defective cell, and to set the fuse block 110 to generate fuse data FD_C. The fuse block 110 may be implemented in various forms, as would be apparent to one skilled in the art, including a fuse box programmed by flowing heavy current or irradiating laser, or an electric fuse or nonvolatile memory programmed by electrical means. In other words, the fuse block 110 detects only a column address from the input address ADD and determines that the detected column address corresponds with a preliminarily programmed defective cell. Based on the determination, the fuse block 110 generates the fuse data FD_C.

The column selection circuit & page buffer 120 causes a redundant bit line to replace the bit line connected to a defective cell over all of the substrate layers in response to the fuse data FD_C. The column selection circuit & page buffer 120 also conducts bit-line selection for replacing bit lines, which are connected to defective memory cells in one of the substrate layers, with redundant bit lines respectively. Data can be input to or output from memory cells by way of the selected bit lines. Accordingly, the column repair operation may be conducted for defective cells in the 3D memory device of stacked structure.

Figure 3:
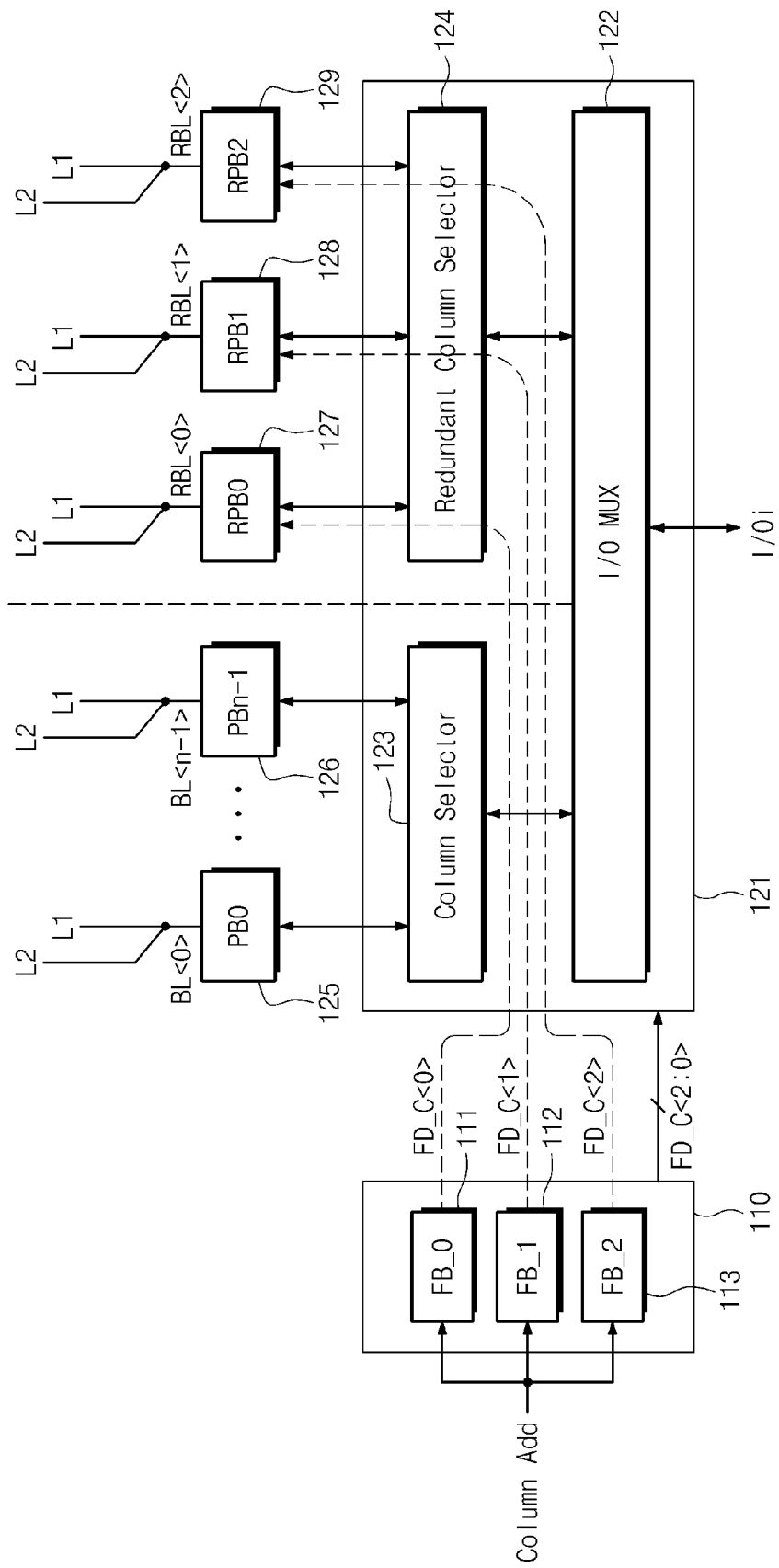
FIG. 3 is a block diagram illustrating a fuse block and a column selection circuit, according to a first embodiment of the present invention.

FIG. 3 is a block diagram illustrating configuration and operation of the fuse block 110 and the column selection circuit & page buffer 120, according to a first illustrative embodiment of the present invention. Referring to FIG. 3, the 3D memory device includes the fuse block 110, which finds a column address corresponding to a defective cell. The fuse block 110 determines to begin the repair operation by comparing an input column address ADD with a column address of a programmed defective cell. When an input column address ADD is identical to the column address of the programmed defective cell, the fuse block 110 controls the column selection circuit 121 to replace a bit line (and/or page buffer), which corresponds to the defective cell, with a designated redundant bit line.

More particularly, the fuse block 110 includes fuse boxes FB_0~FB_2 for storing information of defective column addresses used for designating redundant bit lines. The fuse boxes FB_0~FB_2 are programmed with defective column addresses for selecting the redundant bit lines independently. It may be assumed that an address of a defective column is programmed in each of the fuse box (FB_0) 111, the fuse box (FB_1) 112 and the fuse box (FB_2) 113, for example.

When the column address programmed in the fuse box (FB_0) 111 is identical to an input column address ADD, the fuse box (FB_0) 111 generates fuse data FD_C<0> and provides fuse data FD_C<0> to the column selection circuit 121 to replace the defective column. Accordingly, redundant bit line RBL<0> and redundant page buffer (RPB0) 127 are selected instead of a bit line corresponding to the defective column. When the column address of a defective column programmed in fuse box (FB_1) 112 is identical to an input column address ADD, the fuse box (FB_1) 112 generates and provides fuse data FD_C<1> to the column selection circuit 121, which selects redundant bit line RBL<1> and redundant page buffer (RPB1) 128 instead of a bit line corresponding to the defective column. Likewise, when the column address programmed in fuse box (FB_2) 113 is identical to an input column address ADD, the fuse box (FB_2) 113 generates and provides fuse data FD_C<2> to the column selection circuit 121, which selects redundant bit line RBL<2> and redundant page buffer (RPB2) 129 instead of a bit line corresponding to the defective column. The fuse data FD_C<0>~FD_C<2> may also be implemented as repair signals.

Unless an input column address is identical to the defective column address programmed in the fuse boxes FB_0~FB_2, the fuse block 110 inactivates the repair signals. Then, the column selection circuit 121 controls the column selector 123 to designate the normal bit lines BL<0>~BL<n−1> and the page buffers PB0~PBn−1.

The column selection circuit 121 includes an input/output multiplexer 122, a main column selector 123 and a redundant column selector 124. The redundant column selector 124 and the input/output multiplexer 122 are activated by the fuse data FD_C<2:0> provided from the fuse boxes, and enables the redundant bit lines RBL<0>~RBL<2> and the redundant page buffers RPB0~RPB2 to be connected with input/output lines I/Oi.

As can be seen from FIG. 3, the fuse boxes of the fuse block 110 are arranged respective to the redundant bit lines. Also, the fuse block 110 replaces a defective column with a redundant column in response only to a column address, without address information regarding corresponding substrate layers. That is, if at least one of the memory cells (in corresponding substrate layers) sharing a bit line is defective, the entire bit line is replaced with a redundant bit line. In this case, even non-defective cells among the memory cells sharing the single bit line must be replaced with corresponding redundant memory cells of the redundant bit line, regardless of the substrate layer. That is, a memory cell (or column) of a substrate having no defects may still be effectively regarded as defective. Accordingly, there must be sufficient redundant memory cells prepared to accommodate replacement of non-defective, as well as defective memory cells in repair operations, which results in increased cost.

Figure 4:
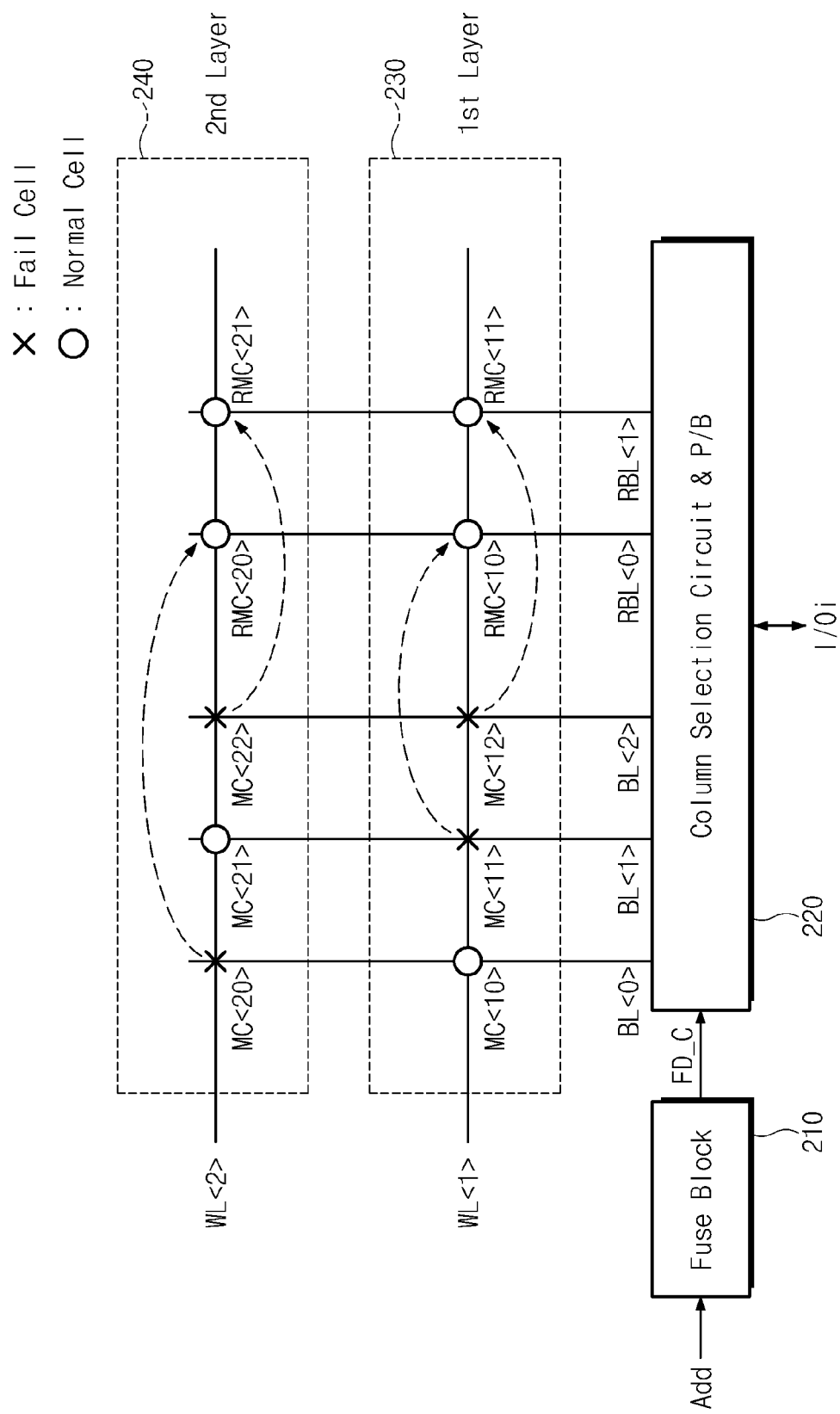
FIG. 4 is a schematic diagram illustrating a repair method, according to a second embodiment of the present invention.

FIG. 4 is a schematic diagram illustrating a repair method, according to a second illustrative embodiment of the present invention, which may enhance economical efficiency. Referring to FIG. 4, redundant bit lines can be set by a fuse block 210 to repair defective columns in correspondence with the maximum number of substrate layers. In other words, the fuse block 210 is configured to repair multiple defective bit lines (or columns) with a single redundant bit line. This provides a high-efficiency column redundancy structure of the 3D memory device, according to the present embodiment, as described below.

The fuse block 210 finds a defective column from sensing an input address ADD, and outputs a repair signal to activate the column redundancy chain if the input address ADD corresponds to the defective column. The fuse block 210, according to the second illustrative embodiment, includes fuse boxes in which column addresses are programmed in correspondence with the maximum number of substrate layers. In the 3D memory device having a cell array formed in two substrate layers, for example, two fuse boxes are allocated to select one redundant bit line. Thus, the fuse box corresponding to a redundant bit line is set to sense two column addresses. With this fuse box configuration, a single redundant bit line is able to provide independent redundancy for each substrate layer.

Therefore, the fuse block 210 must include fuse boxes for storing column addresses corresponding to the number of substrate layers for one redundant bit line. For example, in the 3D memory device with two substrate layers, it is necessary to prepare two fuse boxes for repairing defective columns respective to the first and second substrate layers 230 and 240. The fuse boxes for one redundant bit line is able to store column addresses that correspond to one of defective columns of the first substrate layer and one of defective columns of the second substrate. The configuration and functionality of the fuse block 210 is described in conjunction with FIG. 5.

A column selection circuit & page buffer 220 operates to access memory cells with reference to an input address ADD. During a programming or reading operation, the column selection circuit & page buffer 220 receives a repair signal or fuse data FD_C from the fuse block 210, and then changes selection from a defective bit line (including defective cells) to a redundant bit line.

As shown in FIG. 4, bit lines are shared by the first and second substrate layers 230 and 240 where memory cells are arranged. From FIG. 4, the flow of repair operation for defective columns is indicated by arrows with respect to the fuse block 210 and the column selection circuit & page buffer 220. The bit-line sharing structure is substantially the same as that shown in FIG. 2. The first substrate layer 230 includes memory cells MC<10>, MC<11> and MC<12>, and redundant memory cells RMC<10> and RMC<11>. The second substrate layer 240 includes memory cells MC<20>, MC<21> and MC<22>, and redundant memory cells RMC<20> and RMC<21>. The memory cells MC<10> and MC<20> included in the first and second substrate layers 230 and 240 share the bit line BL<0>.

As shown in FIG. 4, the bit line BL<0> is connected to defective memory cell MC<20> located on the second substrate layer 240 and the bit line BL<1> is connected to defective memory cell MC<11> located on the first substrate layer 230. Although the defects involve different bit lines BL<0> and BL<1>, both are replaced by redundant bit line RBL<0>. Further, the bit line BL<2>, connected to defective cells MC<12> and MC<22> included in the first and second substrate layers 230 and 240, is replaced with redundant bit line RBL<1>, as in the first illustrative embodiment depicted in FIG. 2. According to this repair scheme, it is possible to improve repair efficiency of the 3D memory device having a cell array with multiple substrate layers.

Hence, the repair structure and method may raise product yields of the 3D memory devices, for example. While the 3D memory device is shown to include a 3D cell array formed in two substrate layers, it is understood that this depiction is for purposes of illustration and that various embodiments of the present invention are not restricted to any particular number of substrate layers. That is, embodiments of the present invention are also applicable to 3D memory devices having 3D cell arrays arranged on more than two substrate layers. For instance, in a memory device having a 3D cell array formed in N substrate layers (N being a positive integer) sharing bit lines, one redundant bit line is capable of repairing N defective columns.

Figure 5:
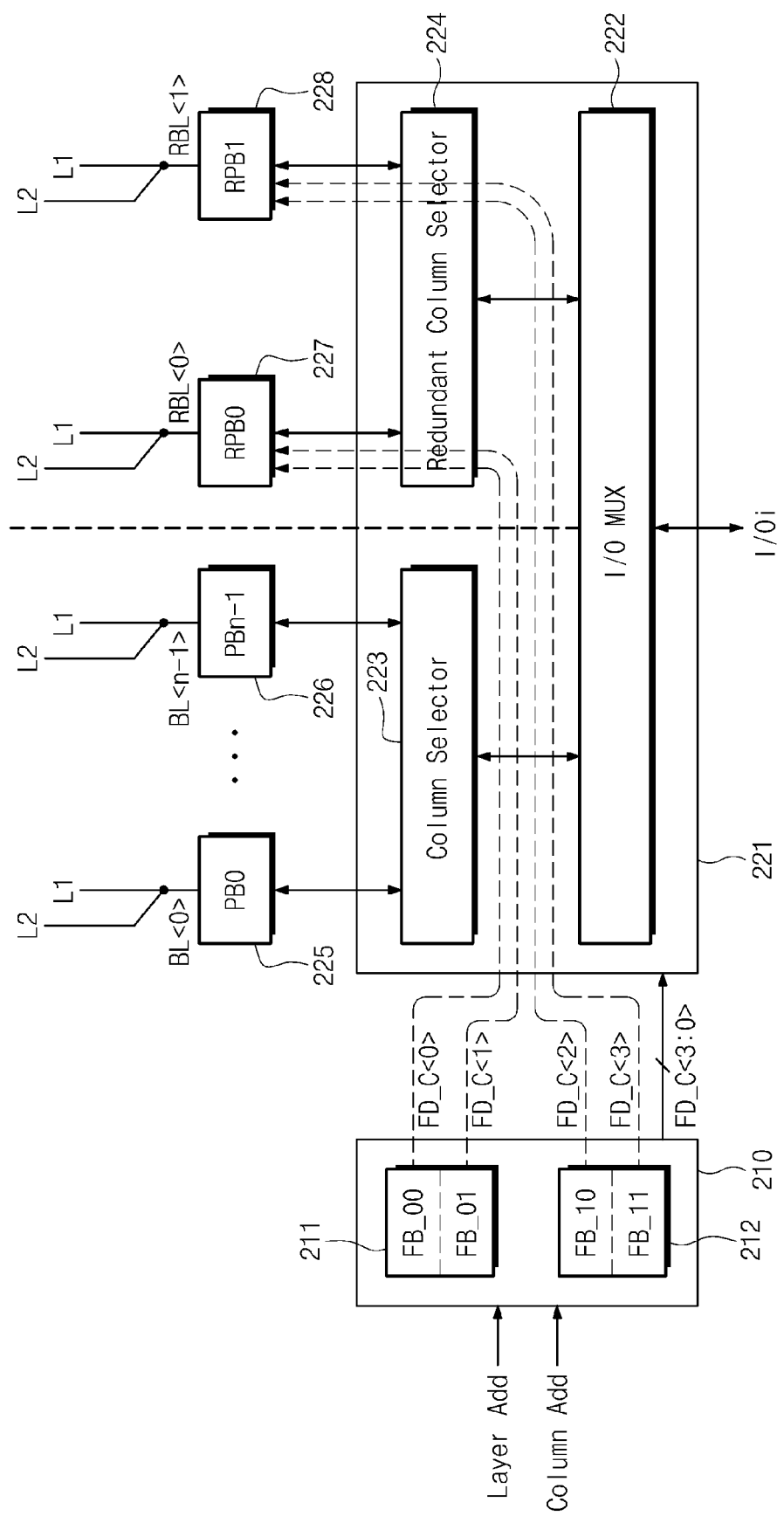
FIG. 5 is a block diagram illustrating a fuse block and a column selection circuit, according to a second embodiment of the present invention.

FIG. 5 is a block diagram illustrating configuration and operation of the fuse block 210, according to a second illustrative embodiment of the present invention. Referring to FIG. 5, the 3D memory device includes the fuse block 210 into which layer addresses of defective cells are programmed. Each fuse box unit 211 and 212 of the fuse block 210 for selecting a redundant bit line includes two fuse boxes. In particular, a unit of column redundancy is capable of repairing two defective columns, which will be discussed further with reference to FIG. 5.

As stated above, the fuse block 210 includes multiple fuse box units, e.g., indicated by representative fuse box units 211 and 212, for selecting redundant bit lines. The fuse box unit for selecting one redundant bit line includes fuse boxes corresponding to the number of substrate layers. For example, the fuse box unit 211 for selecting redundant bit line RBL<0> includes fuse box FB_00 for storing an address of a defective column belonging to the first substrate layer 230, and fuse box FB_01 for storing an address of a defective column belonging to the second substrate layer 240. The fuse box unit 212 for selecting the redundant bit line RBL<1> includes fuse box FB_10 for storing an address of a defective column belonging to the first substrate layer 230, and fuse box FB_11 for storing an address of a defective column belonging to the second substrate layer 240. When a layer address designates the first substrate layer 230, the fuse boxes FB_00 and FB_01 are selected in correspondence with the first substrate layer. When a layer address designates the second substrate layer, the fuse boxes FB_10 and FB_11 are selected in correspondence with the second substrate layer. When there is an address which is the same as a column address in one of the fuse boxes, the fuse box corresponding to the column address generates and transfers repair signals or fuse data FD_C<3:0> to a column selection circuit 221.

The column selection circuit 221 operates to a bit line and input/output data in response to a column address. During a reading operation, when the input column address does not match to an address of a defective column, a main column selector 223 operates to select bit lines BL<0>~BL<n−1> of a main area. Data from bit lines of the main area and corresponding page buffers are selected by an input/output multiplexer 222 in input/output units. During a writing operation, the data flow is reversed to that of the reading operation. When a repair signal or fuse data FD_C<3:0> is generated from one of the fuse boxes FB_00, FB_01, FB_10 and FB_11 of the fuse block 210, the column selection circuit 221 selects a redundant bit line RBL<0>~RBL<1> of a redundant area instead of a defective column of the main area. Address information about a defective column of the first substrate layer is programmed in the fuse box FB_00, while address information about a defective column of the second substrate layer is programmed in the fuse box FB_01, by which the defective columns are repaired by the redundant bit line RBL<1>.

Page buffers 225 and 226 of the main area are selected by the column selector 223 and activated in a normal mode, when a repair signal or fuse data FD_C<3:0> has not been generated by the fuse block 210. Redundant page buffers 227 and 228 of the redundant area are activated in response to inputs of the repair signals or fuse data FD_C<3:0>. The redundant page buffer (RPB0) 227 and the redundant bit line RBL<0> are selected by the fuse box unit 211. If the bit line were shared by three substrate layers, for example, the fuse box unit 211 for selecting the redundant page buffer RPB0 and the redundant bit line RBL<0> would be programmed with column addresses corresponding to the three substrate layers, in which case, the three column addresses may be the same or different from each other. This configuration of the fuse box unit 211 corresponding to the redundant page buffer RPB0 and the redundant bit line RBL<0> is also applied to the configuration of the fuse box unit 212 corresponding to redundant page buffer RPB1 and redundant bit line RBL<1>. In particular, each redundant bit line selected by the fuse boxes corresponds to the number of substrate layers of the 3D cell array.

With reference to the structure of the fuse block 210 and the column selection circuit 221 shown in FIG. 5, the repair operation for defective cells will be described in conjunction with FIG. 4. The fuse box FB_00 for selecting the redundant bit line RBL<0> is programmed with a column address of the bit line BL<1> that has the defective cell MC<11> in the first substrate layer 230. The fuse box FB_01 for selecting the redundant bit line RBL<0> is programmed with a column address of the bit line BL<0> that has the defective cell MC<20> in the second substrate layer 240. Through this fuse programming, the redundant bit line RBL<0> can be used for repairing a defective column corresponding to the defective bit lines BL<0> and BL<1> assigned to different column addresses. A column address of the bit line BL<2> having defective cells in both the first and second substrate layers 230 and 240 is commonly programmed in the fuse boxes FB_10 and FB_11. In this case, regardless of layer address, the redundant bit line RBL<1> is selected for an address correspondent to the bit line BL<2>.

According to the second illustrative embodiment described in conjunction with FIGS. 4 and 5, column redundancy is operable with a redundant bit line in a number corresponding to the number of substrate layers of the 3D cell array. If the 3D cell array is formed in a stacked structure of five substrate layers, for example, one redundant bit line is capable of repairing up to five defective columns. Thus, the 3D memory device is able to maximize the efficiency of redundancy.

Figure 6:
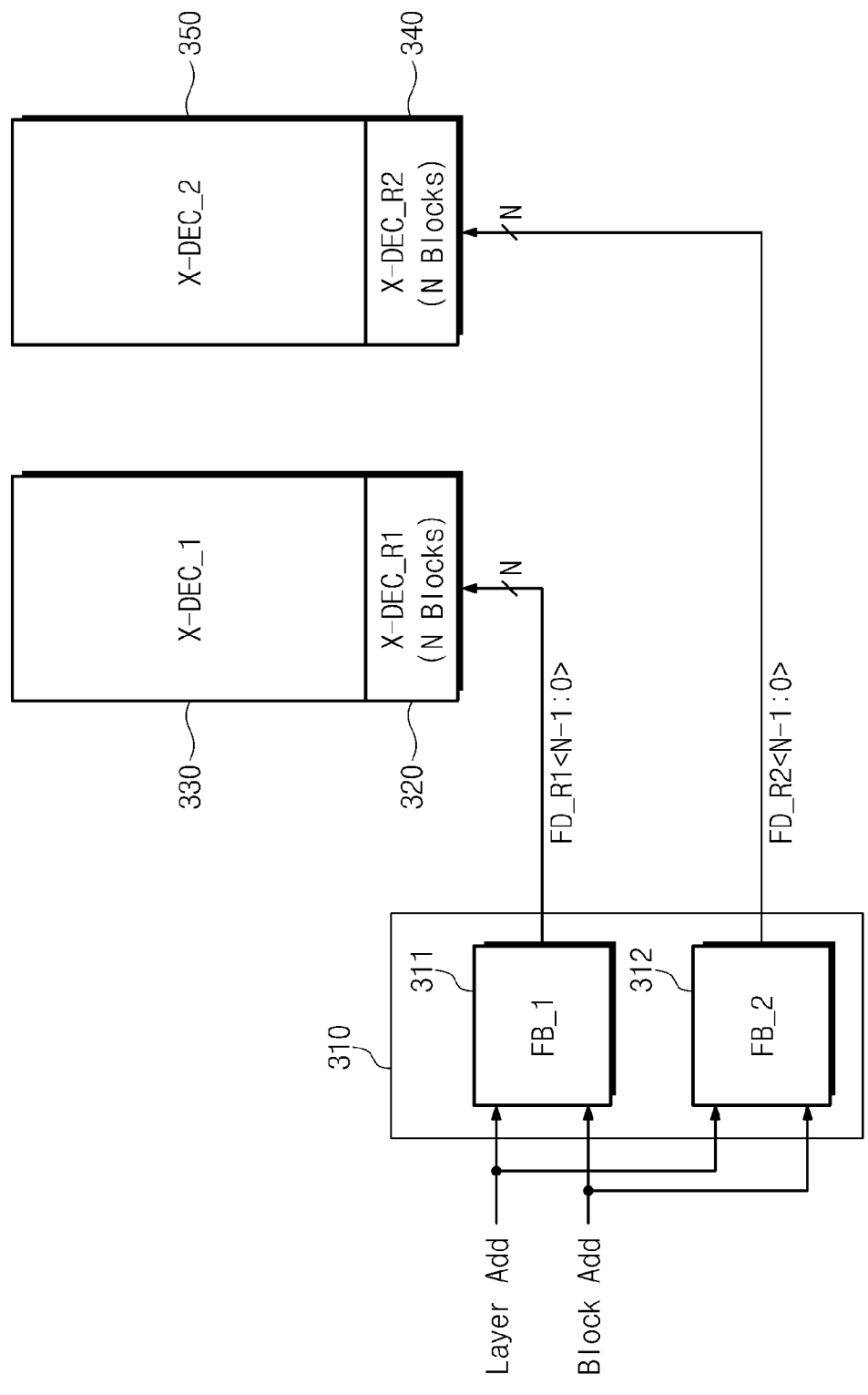
FIG. 6 is a block diagram of a 3D memory device for repairing a row defect, according to a third embodiment of the present invention.

FIG. 6 is a block diagram of a 3D memory device for repairing a row defect, according to a third illustrative embodiment of the present invention. With reference to FIG. 6, a row repair method of the 3D memory device will be described, where the 3D memory device has row decoders corresponding to substrate layers. A representative block decoding scheme of a flash memory device will be adopted for purposes of discussion, although embodiments of the invention are not limited to such a scheme.

A fuse block 310 for selecting redundant blocks having different layer addresses, but the same block address, includes fuse box units 311 and 312 corresponding to the number of substrate layers of the 3D cell array. In the depicted example, the 3D cell array has two substrate layers, and thus the fuse block 310 is configured to include the two fuse box units 311 and 312. In particular, the fuse block 310 includes first fuse box unit 311 for activating redundant blocks in a first substrate layer, and second fuse box unit 312 for activating redundant blocks in a second substrate layer. The first fuse box unit 311 may include multiple fuse boxes for storing defective block addresses of the first substrate layer. The second fuse box unit 312 may include multiple fuse boxes for storing defective block addresses of the second substrate layer. When a layer address Layer ADD input to the fuse block 310 corresponds to the first substrate layer, the first fuse box unit 311 is selected. When a block address Block ADD input to the fuse block 310 is identical to one of the defective block addresses programmed in the first fuse box unit 311, the first fuse box unit 311 outputs a repair enabling signal FD_R1<N-1:0> to select one of N redundant blocks. Then, a block decoder included in a row decoder 330 of the first substrate layer is inactivated in correspondence with the defective block, while a block decoder included in a redundant row decoder 320 is activated to repair the defective block.

The second fuse box unit 312 is programmed with block addresses of defective blocks in the second substrate layer. When layer address Layer ADD among address bits input thereto corresponds to the second substrate layer, the second fuse box unit 312 is selected. When the block address Block ADD is identical to one of the defective block addresses programmed in the second fuse box unit 312, the second fuse box unit 312 outputs a repair enabling signal ED_R2<N-1:0> to select one of N redundant blocks. Then, a block decoder included in a row decoder 350 of the second substrate layer is inactivated in correspondence with the defective block, while a block decoder included in a redundant row decoder 340 is activated to repair the defective block.

According to the 3D memory device with the row redundancy structure, described above, memory blocks having defects in substrate layers are repaired by replacing the defective memory blocks with redundant memory blocks in corresponding substrate layers. For the repair function, the fuse block 310 includes the fuse box units 311 and 312 for activating the redundant blocks corresponding with the substrate layers.

Figure 7:
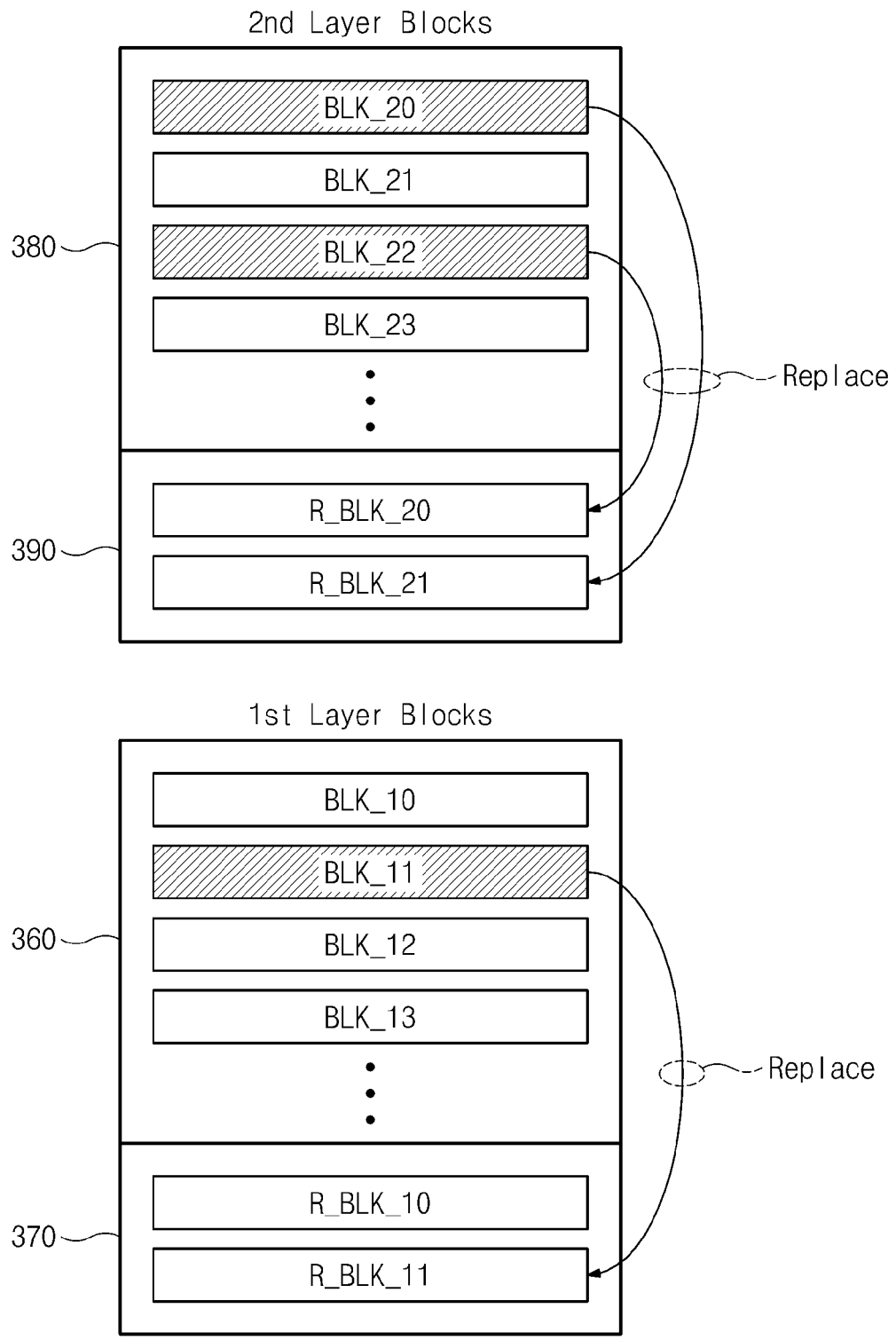
FIG. 7 is a schematic diagram illustrating a repair method, according to a third embodiment of the present invention.

FIG. 7 is a schematic diagram illustrating the row repair operation conducted by the 3D memory device shown in FIG. 6 in first and second substrate layers, according to a third illustrative embodiment of the present invention. Referring to FIG. 7, defective memory blocks included in each substrate layer are repaired (or replaced) with redundant memory blocks of the same substrate layer.

In the first substrate layer, when there is a defect in a memory block BLK_11 of the main area 360, for example, a block address of the memory block BLK_11 is programmed in the fuse box unit (e.g., fuse box unit 311 of FIG. 6). When a layer address Layer ADD is input corresponding to the first substrate layer and a block address Block ADD corresponding to the memory block BLK_11, the fuse box unit 311 generates the repair enabling signal FD_R1<N-1:0> to select a redundant memory block R_BLK_11 instead of the memory block BLK_11. Then, the redundant memory block R_BLK_11 is selected in response to the repair enabling signal FD_R1<N-1:0>.

Likewise, in the second substrate layer, when there are defects in memory blocks BLK_20 and BLK_22 of the main area 380, for example, block addresses of defective memory blocks are programmed in the fuse box unit (e.g., fuse box unit 312 of FIG. 6). The fuse block 312 is activated when a layer address Layer ADD input thereto corresponds to the second substrate layer. When one of the block addresses programmed in the fuse box unit 312 is identical to a block address Block ADD input thereto, the fuse box unit 312 selects a redundant memory block in order to replace the defective block. When the block address Block ADD matches an address of the memory block BLK_20, the fuse box unit 312 activates a bit of the repair enabling signal FD_R2<N-1:0> to select the redundant memory block R_BLK_21 instead of the defective memory block BLK_20. When the block address Block ADD matches an address of the memory block BLK_22, the fuse box unit 312 activates a bit of the repair enabling signal FD_R2<N-1:0> to select the redundant memory block R_BLK_20 instead of the defective memory block BLK_22.

Accordingly, in the 3D memory device having independent row decoders (or block decoders) corresponding to cell arrays disposed in substrate layers, the redundant memory blocks include fuse blocks respectively allocated to the substrate layers. This repair structure provides row redundancy architecture in the 3D memory device having a 3D cell array.

However, the 3D memory device may be unable to repair a defective memory block when the total number of defective memory blocks in a substrate layer exceeds the number of replaceable redundant memory blocks, which may affect reliability. A 3D memory device according to a fourth embodiment addresses this issue, replacing a defective memory block with a redundant memory block placed in a substrate layer different from that of the defective memory block.

Figure 8:
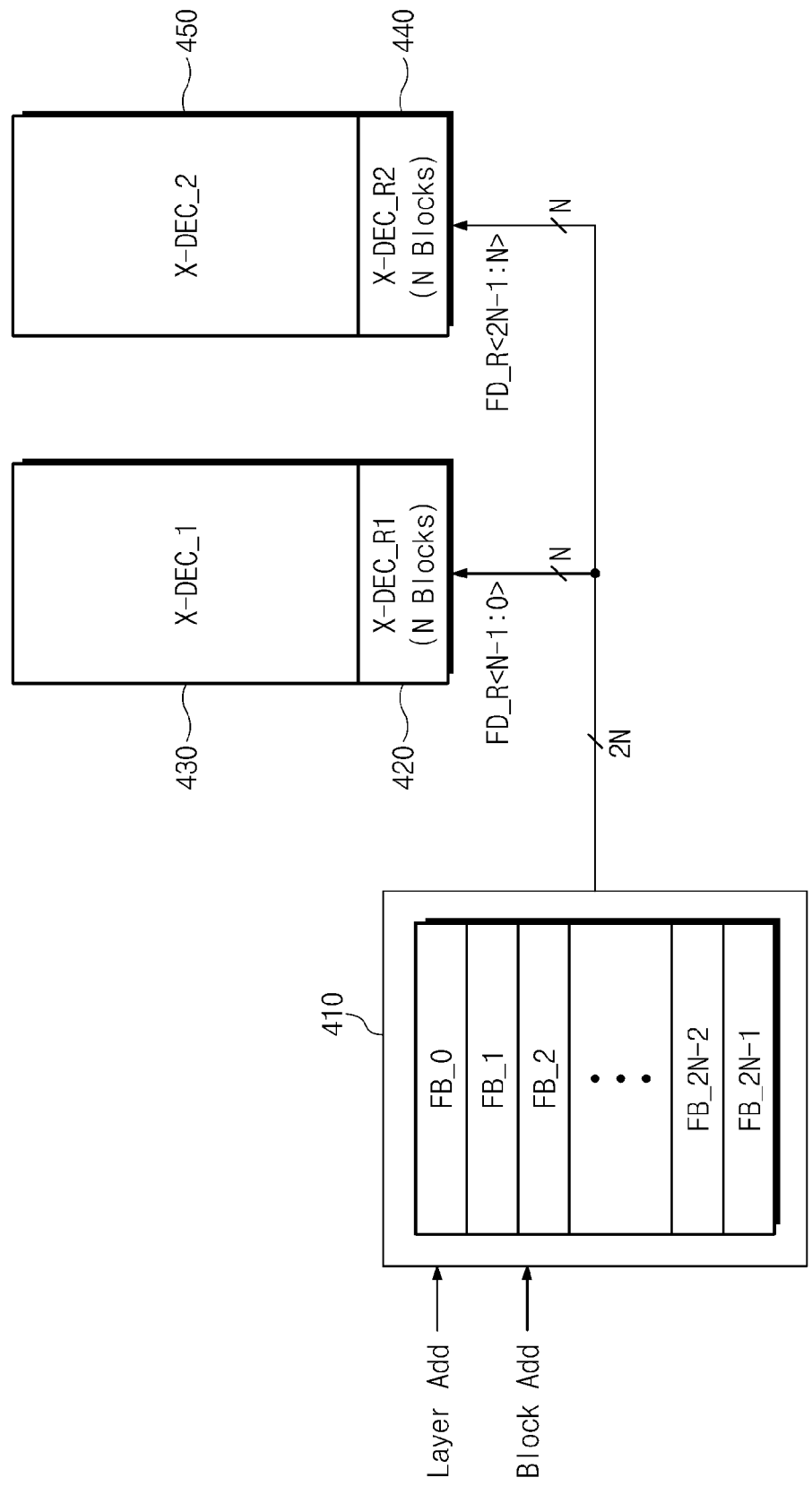
FIG. 8 is a block diagram illustrating a 3D memory device for repairing a row defect, according to a fourth embodiment of the present invention.

FIG. 8 is a block diagram of a 3D memory device for repairing a row defect, according to a fourth illustrative embodiment of the present invention, effectively based on block redundancy structure of the third embodiment shown in FIG. 6. Referring to FIG. 8, a fuse block 410 accepts a layer address Layer Add and block address Block Add, and detects whether the addresses match with fuse data programmed therein, indicating a defective block. When an input address is identical to an address of a defective block, the fuse block 410 is able to select a redundant memory block, which replaces the defective block, regardless of the location of the substrate layer. For instance, when a defective block to be detected is located in the first substrate layer, a redundant memory block replacing the defective block can be selected from redundant memory blocks located in the first or second substrate layer.

The fuse block 410 includes fuse boxes FB_0~FB_2N−1 capable of selecting all redundant memory blocks included in a 3D cell array. Assuming that there are 2N redundant memory blocks included in the first and second substrate layers, fuse boxes are prepared for storing 2N defective block addresses (including layer addresses). In other words, each of the fuse boxes FB_0~FB_2N−1 includes fuse units for storing a layer address of a defective memory block. Thus, repairing a defective memory block is accomplished simply by programming layer and block addresses of the defective memory block into one of the fuse boxes FB_~FB_2N−1.

When a defective memory block needs to be repaired by a redundant memory block in a substrate layer different from that of the defective memory block, a defective block address is programmed into a fuse box corresponding to the redundant memory block. That is, the fuse box is programmed with a layer address, which indicates a location of the substrate layer, along with the defective block address.

Therefore, there are no limits on the location of the substrate layer in programming the fuse block 410 during the repair operation for defective memory blocks. Even when the redundant memory blocks are all used from one of the substrate layers, the redundant memory blocks residing in another substrate layer can be consumed for the remainder of the block repair operation, regardless of substrate layer location.

Figure 9:
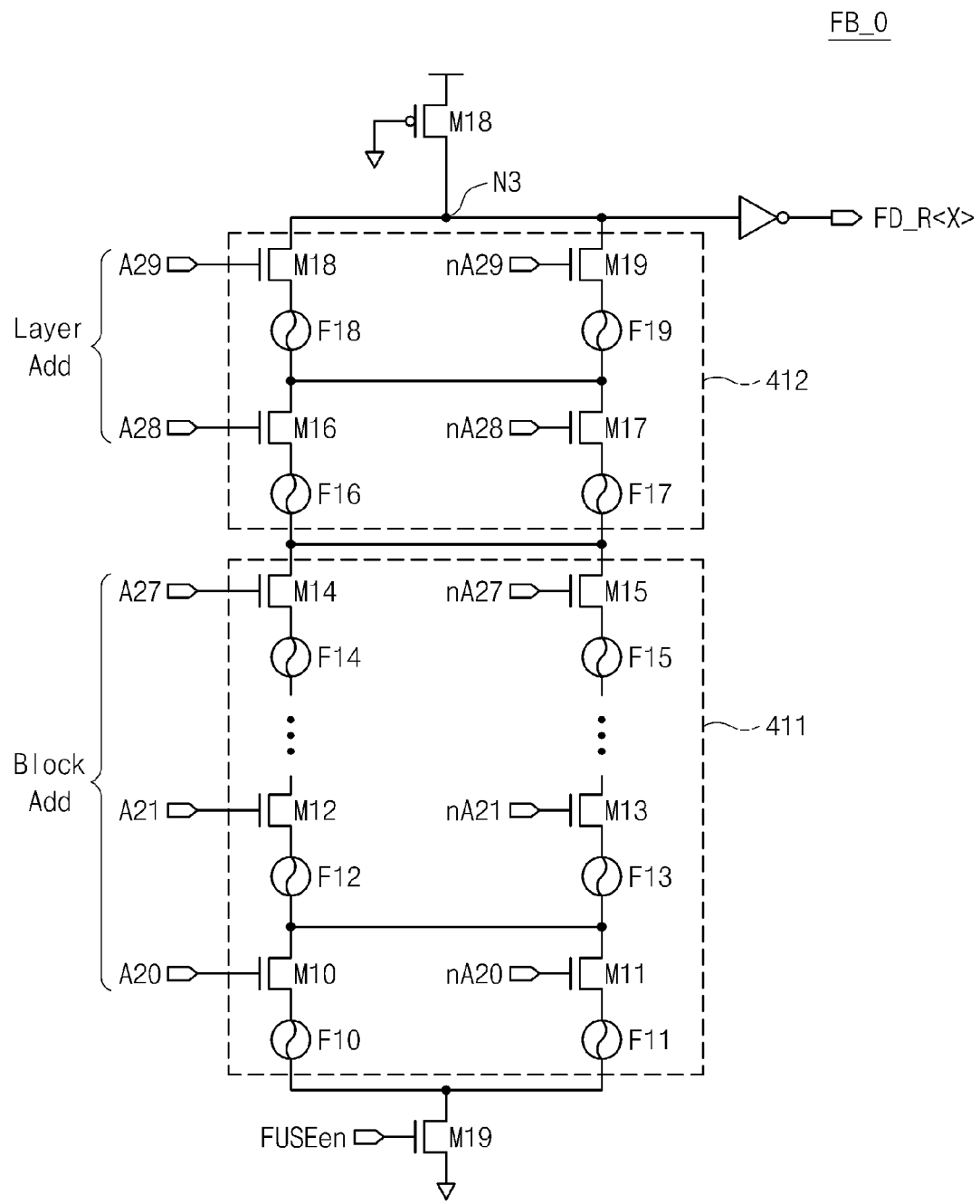
FIG. 9 is a circuit diagram illustrating fuse units of the fuse box, according to a fourth embodiment of the present invention.

FIG. 9 is a circuit diagram illustrating fuse units of a representative fuse box shown in FIG. 8, such as fuse box FB_0, according to a fourth illustrative embodiment of the invention. Referring to FIG. 8, the fuse box FB_0 operates to select its corresponding redundant memory block by activating fuse data FD_R<X> when programmed states (or cut-off states) of fuses F10~F19 match input address bits A20~A29 and nA20~nA29, respectively.

The fuse box FB_0 is configured to include fuse units 411 for storing a block address of a defective memory block, and fuse units 412 for storing a layer address, indicating the substrate layer that includes the defective memory block. Thus, although the fuse box FB_0 selects a redundant memory block that is placed in the first substrate layer, the redundant memory block can be used to repair a defective memory block of the second substrate layer if the fuse units 412 are programmed with a layer address corresponding to the second substrate layer. This is accomplished by programming a layer address of the second substrate layer into the corresponding fuses F16~F19. While FIG. 9 shows an example configuration in which a layer address is allocated to the address bits A28 and A29, this for illustrative purpose only, and it is understood that the fuse box FB_0 is not restricted to this configuration in various embodiments of the present invention.

Figure 10:
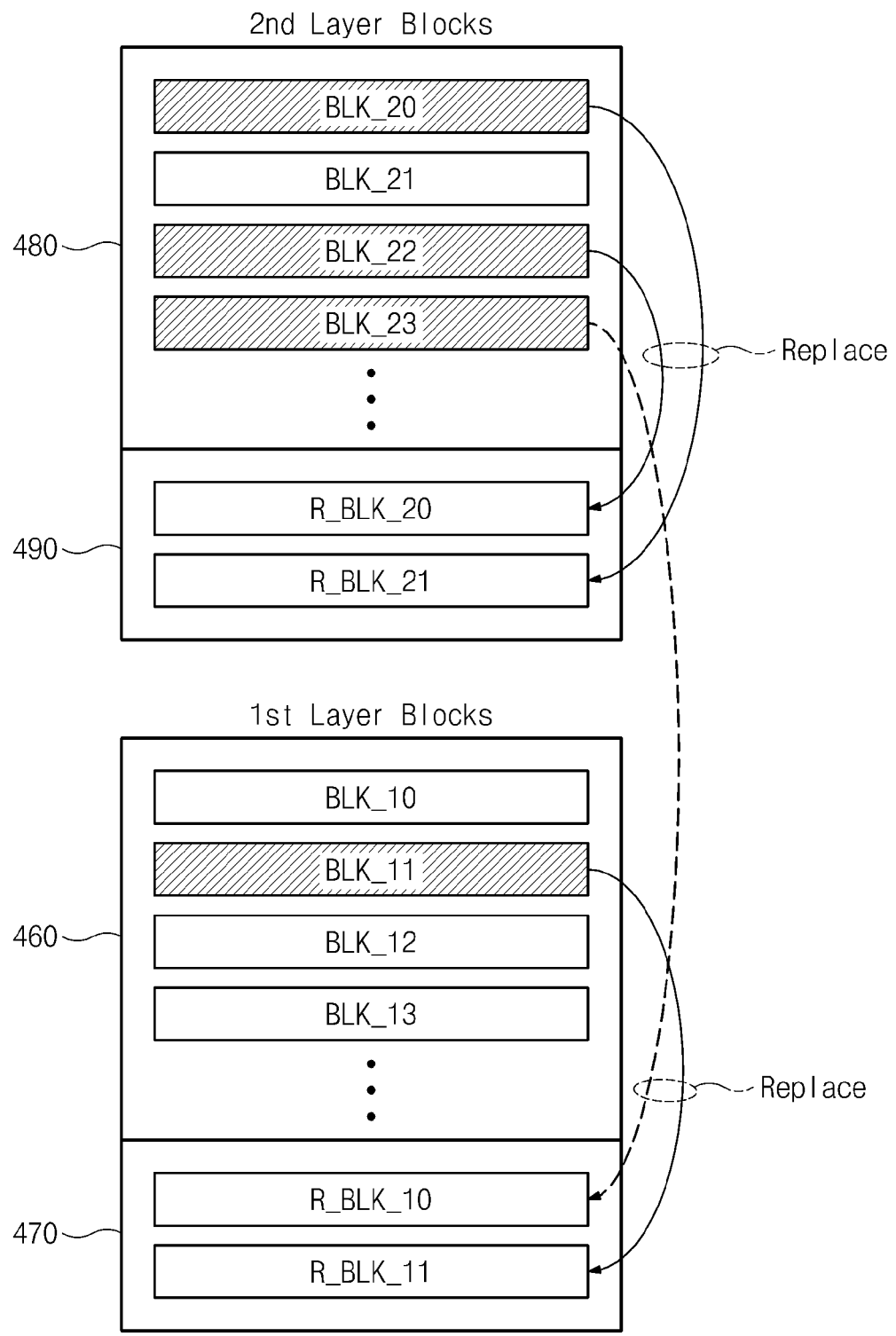
FIG. 10 is a schematic diagram illustrating a block repair method, according to a fourth embodiment of the present invention.

FIG. 10 is a schematic diagram illustrating the block repair operation of the fuse box structure shown in FIG. 9, according to a fourth illustrative embodiment of the present invention. Referring to FIG. 10, defective memory blocks distributed over the substrate layers can be replaced with redundant memory blocks located in the same substrate layer. Additionally, even if there are more defective blocks from main area 480 of the second substrate layer than redundant blocks prepared in redundant area 490 of the first substrate layer, it is still possible for the 3D memory device to repair the excess detective blocks successfully. For instance, if the memory block BLK_23 in the second substrate layer is defective, it can be replaced with the redundant memory block R_BLK_10 of the first substrate layer by adding a fuse to the fuse block in correspondence with a layer address. In other words, when there are no more redundant memory blocks in the same substrate layer, the defective memory block BLK_23 can be repaired by a remaining redundant memory block R_BLK_10 located in the first substrate layer.

Accordingly, even when defective memory blocks are concentrated on a specific substrate layer, the 3D memory device is still able to reliably repair all of the defectives successfully. Therefore, the repair scheme according to the present embodiment is helpful to enhancing product yield of the 3D memory device.

Figure 11:
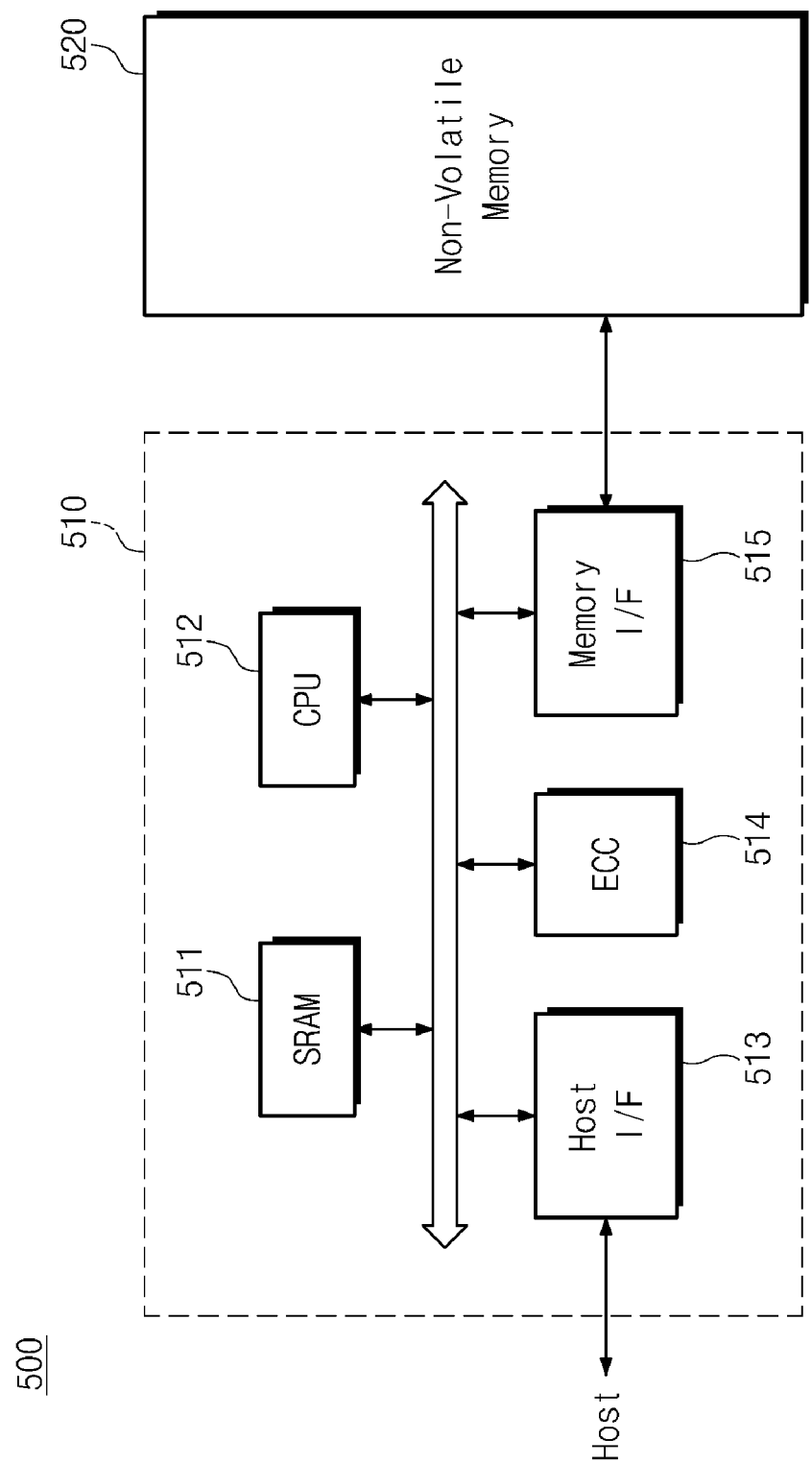
FIG. 11 is a block diagram of a memory system including the 3D memory device, according to embodiments of the present invention.

FIG. 11 is a block diagram of a memory system 500, such as a memory card or solid state disk (SSD), including a nonvolatile memory device 520 with a 3D cell array, according to illustrative embodiments of the present invention. Referring to FIG. 11, the memory system 500, capable of storing a large quantity of data, includes the nonvolatile memory device 520 having a stacked array structure. The memory system 500 includes a memory controller 510 for controlling an overall data exchange between a Host and the nonvolatile memory device 520. The memory system 500 includes the nonvolatile memory device 520 which has been fabricated with a 3D memory device having a stacked structure.

Static random access memory (SRAM) 511 is used as an operational memory for processing unit 512. Host interface 513 is equipped with a data exchange protocol of the Host connected to the memory system 500. An error check/correction (ECC) block 514 operates to detect and correct errors from data read out from the nonvolatile memory device 520. A memory interface 515 operates to interface with the nonvolatile memory device 520. The central processing unit (CPU) 512 conducts overall control operations for exchanging data with the memory controller 510. Although not shown in FIG. 11, it is understood by those skilled in the art that the memory system 500 may further include read-only memory (ROM) to store code data, for example, to interface with the host.

The nonvolatile memory device 520 may be formed of a flash memory device or a resistive memory, such as a phase-change RAM or resistance RAM, although the nonvolatile memory device 520 may be formed of various other kinds of storage devices, such as a nano floating gate memory (NFGM), a polymer RAM (PoRAM), a magnetic RAM (MRAM), or a ferroelectric RAM (FRAM). While FIG. 11 illustrates a configuration including a single nonvolatile memory device 520, it is understood that multiple nonvolatile memory devices 520 may be included, for example, in the form of a multi-chip package (MCP) where multiple devices are fabricated in a single package.

The memory system 500 may be formed in an SSD, which enables large capacity implementation. Although not shown in FIG. 11, the memory system 500 may be provided as a reservoir for an information processing apparatus capable of exchanging large amounts of data with an application chipset, a camera image processor (CIS), a mobile DRAM, or the like. Additionally, the memory system 500 may be configured in a MultiMedia Card (MMC), a Secure Digital (SD) card, a micro-SD card, a memory stick, an identification (ID) card, a Personal Computer Memory Card International Association (PCMCIA) card, a chip card, a Universal Serial Bus (USB) card, a smart card, a Compact Flash (CF) card, or the like.

Figure 12:
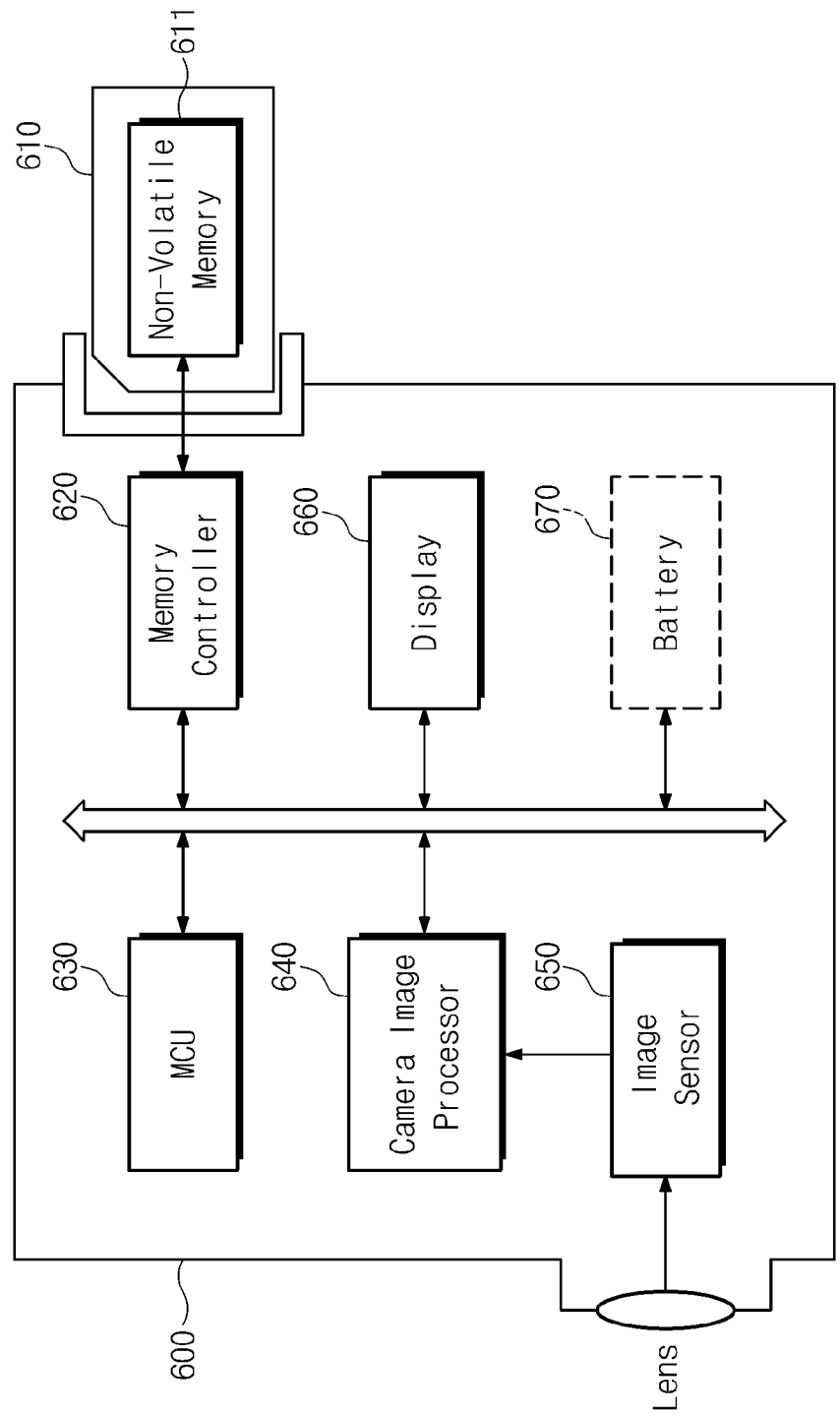
FIG. 12 is a block diagram illustrating a digital still camera equipped with a memory system, according to embodiments of the present invention.

FIG. 12 is a block diagram illustrating a functional configuration of an electronic apparatus equipped with a memory system, according to illustrative embodiments of the present invention. The electronic apparatus may be implemented in a digital still camera 600, for example, as shown in FIG. 12. The digital still camera 600 includes a memory system 610 configured in accordance with embodiments of the present invention. The memory system 610 embedded in the digital still camera 600 includes a nonvolatile memory device 611 as data storage, for example. The nonvolatile memory device 611 may be formed in the 3D stacked structure, as described with respect to various embodiments. The digital still camera 600 also includes a card interface or memory controller 620 for enabling an interface with the memory system 610, a microcontroller unit (MCU) 630, and a camera image processor 640, all of which are connected to a bus. The camera image processor 640 receives an image signal from an image sensor 650, generating an optical image from a lens. The digital still camera 600 also includes a display 660 providing a visual image based on an image signal. Further, the digital still camera 600 includes a battery 670 for supplying power. Although not shown in FIG. 12, the memory system 610 of the digital still camera 600 may be further associated with an application chipset, a mobile DRAM, etc.

The nonvolatile memory device 611 is able to retain data, even without power. Increasingly used in mobile apparatuses, such as cellular phones, personal digital assistants (PDAs), digital cameras, portable game consoles, MP3 players, global positioning systems (GPS), and the like, nonvolatile memory devices, such as the nonvolatile memory device 611, are widely employed for code storage, as well as data storage. Furthermore, nonvolatile memory devices can be utilized in home applications, such as high definition (HD) televisions, digital video disks (DVDs), routers, and the like.

The nonvolatile memory device 611 may also be applied as an embedded system, which is a computing system that at least partially embeds other types of devices configured to exclusively conduct a specific computing function, unlike a generic computer. An embedded system must have an operating system with a central processing unit, executing a specific process by running an application. Examples of embedded systems include systems for controlling military apparatuses, industrial machines, communication systems, set-top boxes and household electric appliances, such as digital televisions and digital cameras.

Figure 13:
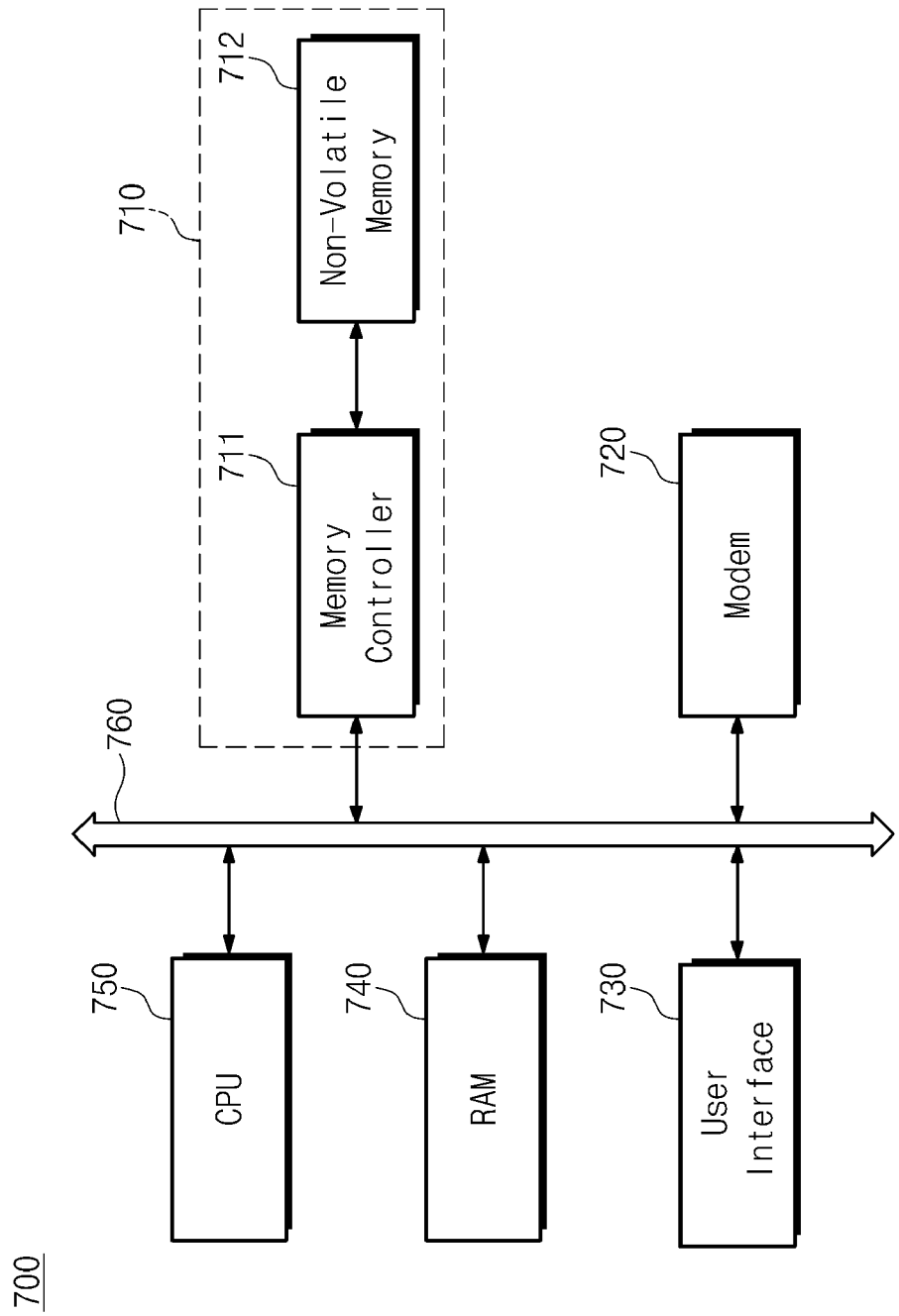
FIG. 13 is a block diagram of a computing system equipped with a memory system, according to embodiments of the present invention.

FIG. 13 is a block diagram of a computing system 700 equipped with a memory system 710, according to illustrative embodiments of the present invention. Referring to FIG. 13, the memory system 710 is embedded in an information processing system, such as the computing system 700, e.g., a mobile apparatus or desktop computer. The computing system 700 includes the memory system 710 formed of an interface or memory controller 711 and a nonvolatile memory device 712. The computing system 700 further includes a CPU 750, RAM 740, a user interface 730 and a modem 720, all of which are electrically connected to a bus 760. The memory system 710 may be configured to have the same structure as the memory card or system, discussed above, and the nonvolatile memory device 712 may be configured to have the 3D stacked structure, according to various embodiments. Data provided through the user interface 730 or processed from the CPU 750 are stored in the nonvolatile memory device 712 by way of the memory controller 711. The CPU 750 and other system components, as hosts to the memory system 710, can be provided with highly reliable data from the memory system 710. The computing system 700 as shown in FIG. 13 may be installed in a desktop computer or a portable apparatus, such a notebook computer or mobile phone, for example.

Figure 14:
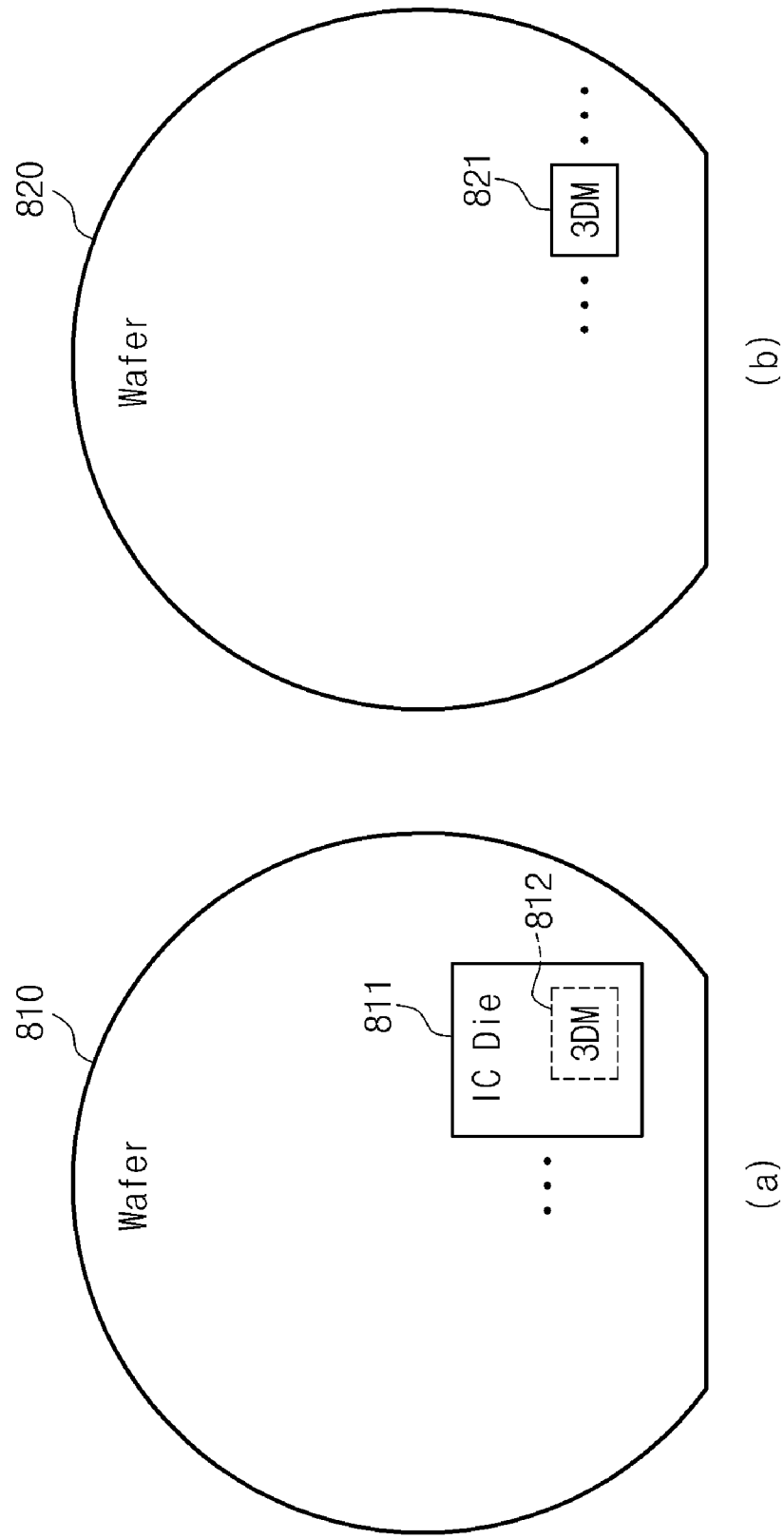
FIGS. 14(*a*) and 14(*b*) illustrates a schematic process for manufacturing a 3D memory device, according to embodiments of the present invention.

FIGS. 14(a) and 14(b) are schematic diagrams showing a process for manufacturing the 3D memory device on a wafer, according to illustrative embodiments of the present invention. The 3D memory device is formed on a 3D memory area provided in an integrated circuit, or formed as an exclusive chip die.

Referring to FIG. 14(a), the 3D memory device 812 may be included in an integrated circuit (IC) die 811 of wafer 810. The IC die 811 may be configured in an application chipset (e.g., display driver IC (DDI) or magnetic shape memory (MSM)), a CPU, a system-on-chip (SoC) having various properties. The 3D memory device 812 included in the IC die 811 may be used as a cache memory for fast data access, a ROM or boot-up memory with nonvolatile characteristics, for example.

Referring to FIG. 14(b), the 3D memory device 821 of wafer 820 may be manufactured in a single product, such as a volatile or nonvolatile memory. The 3D memory device 821 may be configured in a kind of resistive memory, such as a PRAM or resistance RAM, or a nonvolatile memory, such a NFGM, PoRAM, MRAM, FRAM, or the like.

Further, a 3D memory device or an IC or memory system including the 3D memory device, according to various illustrative embodiments, can be mounted on the computing system by means of various types of packages. For example, the memory system may be included by any package type, e.g., Package-on-Package (PoP), Ball Grid Arrays (BGAs), Chip Scale Packages (CSPs), Plastic Leaded Chip Carrier (PLCC), Plastic Dual In-line Package (PDIP), Die in Waffle Pack, Die in Wafer Form, Chip-On-Board (COB), CERamic Dual In-line Package (CERDIP), Plastic Metric Quad Flat Pack (MQFP), Thin Quad Flat Pack (TQFP), Small Outline (SOIC), Shrink Small Outline Package (SSOP), Thin Small Outline (TSOP), Thin Quad Flat Pack (TQFP), System In Package (SIP), Multi-Chip Package (MCP), Wafer-level Fabricated Package (WFP), Wafer-level Processed Stack Package (WSP), or Wafer-level Processed Package (WSP).

As described above, embodiments of the present invention provide a redundancy scheme for efficient repair, even to a 3D memory device having a stacked cell array structure, thus improving product yields of the 3D memory devices.

While the present invention has been described with reference to exemplary embodiments, it will be apparent to those skilled in the art that various changes and modifications may be made without departing from the spirit and scope of the present invention. Therefore, it should be understood that the above embodiments are not limiting, but illustrative.

What is claimed is:

1. A nonvolatile memory device, comprising:
 a three-dimensional (3D) cell array comprising a plurality of cell arrays located in a corresponding plurality of stacked substrate layers, the cell arrays sharing a bit line;
 a column selection circuit selecting a memory unit included in the 3D cell array; and
 a fuse block controlling the column selection circuit to repair a plurality of defective columns with one of a plurality of redundant bit lines located in the 3D cell array.

2. The nonvolatile memory device as set forth in claim 1, wherein the number of the defective columns is equal to or less than the number of the stacked substrate layers.

3. The nonvolatile memory device as set forth in claim 1, wherein the fuse block comprises a fuse circuit storing a defective column address to select the redundant bit line.

4. The nonvolatile memory device as set forth in claim 3, wherein a defective bit line corresponding to the defective column address is connected to a plurality of defective memory units.

5. The nonvolatile memory device as set forth in claim 1, wherein the fuse block comprises a plurality of fuse circuits, each fuse circuit storing a plurality of defective column addresses to select the redundant bit line.

6. The nonvolatile memory device as set forth in claim 5, wherein the fuse circuits correspond to the substrate layers in number.

7. The nonvolatile memory device as set forth in claim 6, wherein each fuse circuit is selected by a layer address corresponding to each substrate layer.

8. The nonvolatile memory device as set forth in claim 1, wherein the memory unit is in a nonvolatile memory.

9. A nonvolatile memory device, comprising:
 a three-dimensional (3D) cell array comprising a plurality of cell arrays formed in a corresponding plurality of stacked substrate layers, the cell arrays sharing a bit line;
 a column selection circuit selecting a bit line connected to the 3D cell array; and
 a fuse block controlling the column selection circuit to repair a plurality of defective columns using one of redundant bit lines located in the 3D cell array in response to a layer address and a column address corresponding to the substrate layer,
 wherein the 3D cell array further comprises:
  first memory units corresponding to the substrate layers and connected to a first bit line;
  second memory units corresponding to the substrate layers and connected to a second bit line; and
  redundant memory units corresponding to the substrate layers and connected to a redundant bit line.

10. The nonvolatile memory device as set forth in claim 9, wherein when there is at least one defective first memory unit, the fuse block stores a column address corresponding to the first bit line and controls the column selection circuit to select the redundant bit line in response to an input of the column address corresponding to the first bit line.

11. The nonvolatile memory device as set forth in claim 9, wherein when the at least one defective first memory unit has a different substrate layer than a defective second memory unit, the fuse block controls the column selection circuit to select the redundant bit line in response to a column address corresponding to the first bit line and a column address corresponding to the second bit line.

12. The nonvolatile memory device as set forth in claim 11, wherein the fuse block comprises at least two fuse box units.

13. The nonvolatile memory device as set forth in claim 12, wherein one of the fuse box units is activated in response to a layer address corresponding to the substrate layer.

14. A nonvolatile memory device comprising:
 a three-dimensional (3D) cell array comprising a plurality of cell arrays formed in a corresponding plurality of stacked substrate layers, the cell arrays sharing a bit line;
 a column selection circuit selecting a bit line connected to the 3D cell array; and
 a fuse block controlling the column selection circuit to repair a defective column with a redundant bit line located in the 3D cell array in response to a column address,
 wherein the 3D cell array further comprises:

a plurality of first memory units corresponding to the plurality of substrate layers and connected to a first bit line;

a plurality of second memory units corresponding to the plurality of substrate layers and connected to a second bit line;

a plurality of first redundant memory units corresponding to the plurality of substrate layers and connected to a first redundant bit line; and a plurality of second redundant memory units corresponding to the substrate layers and connected to a second redundant bit line.

15. The nonvolatile memory device as set forth in claim 14, wherein when there is at least one defective first memory unit, the fuse block stores a column address corresponding to the first bit line and controls the column selection circuit to select the first redundant bit line in response to an input of the column address corresponding to the first bit line.

16. The nonvolatile memory device as set forth in claim 15, wherein when there is at least one defective second memory unit, the fuse block stores a column address corresponding to the second bit line and controls the column selection circuit to select the second redundant bit line in response to an input of the column address corresponding to the second bit line.

17. The nonvolatile memory device as set forth in claim 14, wherein the fuse block comprises a two fuse box unit storing a defective column address to select the redundant bit line.

18. A nonvolatile memory device comprising:
a three-dimensional (3D) cell array comprising a plurality of cell arrays located in a plurality of stacked substrate layers;
a plurality of row decoders corresponding to the plurality of cell arrays and selecting memory blocks of the plurality of cell arrays; and
a fuse block controlling the plurality of row decoders to repair defective memory blocks of cell arrays with redundant memory blocks located in the cell arrays.

19. The nonvolatile memory device as set forth in claim 18, wherein the fuse block comprises a plurality of fuse boxes selecting the redundant memory blocks corresponding the cell arrays.

20. The nonvolatile memory device as set forth in claim 19, wherein each fuse box comprises a storage unit programmed with a layer address corresponding to a substrate layer having a defective memory block.

21. The nonvolatile memory device as set forth in claim 20, wherein the fuse boxes control the row decoders to correspondingly select the redundant memory blocks when the programmed addresses are identical to input block and layer addresses.

22. A nonvolatile memory device comprising:
a three-dimensional (3D) cell array comprising a plurality of cell arrays in a corresponding plurality of stacked substrate layers;
a plurality of row decoders corresponding to the plurality of substrate layers and selecting memory blocks from the cell arrays; and
a fuse block controlling the plurality of row decoders to repair defective memory blocks of the cell arrays with a redundant memory block of the substrate layer having one of the cell arrays.

23. The nonvolatile memory device as set forth in claim 22, wherein the fuse block comprises a plurality of fuse boxes corresponding to the plurality of substrate layers, each fuse box storing a block address of a defective memory block.

24. The nonvolatile memory device as set forth in claim 23, wherein each fuse box is selected by a layer address corresponding to each substrate layer.

25. A memory system comprising:
a nonvolatile memory device as described in claim 1; and
a memory controller controlling the nonvolatile memory device.

* * * * *